United States Patent
Anderson et al.

(10) Patent No.: US 7,518,193 B2
(45) Date of Patent: Apr. 14, 2009

(54) SRAM ARRAY AND ANALOG FET WITH DUAL-STRAIN LAYERS COMPRISING RELAXED REGIONS

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 11/275,492

(22) Filed: Jan. 10, 2006

(65) Prior Publication Data

US 2006/0091472 A1 May 4, 2006
US 2007/0158752 A1 Jul. 12, 2007

(51) Int. Cl.
*H01L 23/62* (2006.01)
(52) U.S. Cl. .................. 257/369; 257/640; 257/649; 257/639; 257/E21.632
(58) Field of Classification Search .............. 257/640, 257/649, 639, 369, E21.632
See application file for complete search history.

(56) References Cited

U.S. PATENT DOCUMENTS

| | | | |
|---|---|---|---|
| 6,492,216 B1 | 12/2002 | Yeo et al. | |
| 6,573,172 B1 | 6/2003 | En et al. | |
| 6,939,814 B2 | 9/2005 | Chan et al. | |
| 2003/0040158 A1* | 2/2003 | Saitoh | 438/279 |
| 2004/0104405 A1 | 6/2004 | Huang et al. | |
| 2004/0126998 A1 | 7/2004 | Feudel et al. | |
| 2004/0203243 A1* | 10/2004 | Keller | 438/691 |
| 2005/0106792 A1 | 5/2005 | Cea et al. | |
| 2005/0133819 A1 | 6/2005 | Kawasaki | |
| 2005/0136583 A1 | 6/2005 | Chen et al. | |
| 2005/0156268 A1 | 7/2005 | Chu | |
| 2005/0156274 A1 | 7/2005 | Yeo et al. | |
| 2005/0158931 A1 | 7/2005 | Chen et al. | |
| 2005/0170594 A1* | 8/2005 | Yeo et al. | 438/300 |
| 2005/0186722 A1* | 8/2005 | Cheng et al. | 438/199 |
| 2005/0218455 A1* | 10/2005 | Maeda et al. | 257/368 |

* cited by examiner

*Primary Examiner*—Kimberly D Nguyen
*Assistant Examiner*—Mohammad T Karimy
(74) *Attorney, Agent, or Firm*—Gibb I.P. Law Firm, LLC; Richard M. Kotulak, Esq.

(57) ABSTRACT

Disclosed is a semiconductor structure and associated method of performing the structure with good performance and stability trade-offs for digital circuits and SRAM cells and/or analog FETs on the same chip. Specifically, a dual-strain layer is formed over digital circuits and the other devices on a chip. The dual-strain layer comprises tensile sections above digital logic n-type transistors, compressive sections above digital logic p-type transistors and additional tensile sections above SRAM cells and/or analog FETs. An amorphization ion-implant is performed to relax the strain over SRAM cell p-FETs and, thereby, eliminate variability and avoid p-FET performance degradation in the SRAM cells. Additionally, this ion-implant can relax the strain above both analog p-FETs and n-FETs and, thereby, eliminate variability and the coupling of the logic device process to the analog FETs and provide more predictable and well-controlled analog FETs.

9 Claims, 6 Drawing Sheets

SRAM ARRAY AND ANALOG FET WITH DUAL-STRAIN LAYERS COMPRISING RELAXED REGIONS

BACKGROUND OF THE INVENTION

1. Field of the Invention

The invention generally relates to dual-strain layers for mechanical stress control to improve charge carrier mobility, and, more particularly, to an improved dual-strain layer that enhances carrier mobility in digital circuits and simultaneously minimizes variability in static random access memory (SRAM) arrays and/or analog field effect transistors (FETs) on the same substrate.

2. Description of the Related Art

The mobility of the charge carriers through the channel region a metal oxide semiconductor field effect transistor (MOSFET) directly affects MOSFET performance. Specifically, carrier mobility affects the amount of current or charge which flows, e.g., as electrons or holes, in the MOSFET channel region. Reduced carrier mobility can reduce the switching speed of a given transistor. Reduced carrier mobility can also reduce the differences between the on and off states and can, therefore, increase susceptibility to noise. Various techniques have been used to improve the charge carrier mobility in such devices. For example, mechanical stress control of the channel regions can be used to enhance hole mobility p-type MOSTFETs (p-FETs) and electron mobility n-type MOSFETs (n-FETs). Specifically, forming a compressive film over a p-FET structure causes enhances hole mobility to optimize p-FET performance. Alternatively, forming a tensile film over an n-FET structure enhances electron mobility to optimize p-FET performance. Thus, state-of-the-art complementary MOSFET (CMOS) devices and other semiconductor structures in which both n-FETs and p-FETs are formed on the same chip often incorporate a dual-strain nitride layer to enhance mobility in both the n-FETs and the p-FETs. Such a dual-strain nitride layer is a nitride layer that has tensile strain regions and compressive strain regions positioned over the n-FETs and the p-FETs, respectively, in order to simultaneously enhance carrier mobility in the channel regions of each of the FETs.

Various masking and physical overlay processes can be used to place the different strain regions and, thus, to form the dual-strain nitride layer such that the boundaries between the different strain regions fall between the n-FETs and p-FETs. However, since a physical overlay is involved in the placement of the different strain regions, there can be significant variability in the nFET and pFET resultant strains depending on the proximity of the individual FETs to this boundary. As a result, there can be an increased variability in the transconductance of such transistors. While this increased transconductance variability may not significantly affect digital logic performance, it can lead to a decrease static random access memory (SRAM) cell stability and performance. Such transconductance variability can also negatively affect the stability and performance of analog FETs. Thus, there is a need for a semiconductor structure that balances carrier mobility enhancement with transconductance variability in order to optimize device stability and performance.

SUMMARY OF THE INVENTION

In view of the foregoing, disclosed is a semiconductor structure that comprises a first device and a second device on a substrate. The first device can comprise a digital circuit such as, a digital complementary metal oxide semiconductor (CMOS) device. Specifically, the first device can comprise at least one digital logic n-type transistor (i.e., a first n-type transistor) and at least one digital logic p-type transistor (i.e., a first p-type transistor). In one embodiment of the structure the second device can comprise a static random access memory (SRAM) cell. Specifically, this second device can comprise at least one n-type transistor (i.e., a second n-type transistor) and at least one p-type transistor (i.e., a second p-type transistor). In another embodiment of the structure the second device can comprise an analog device, such as an n-type analog field effect transistor (FET) or a p-type analog FET. Another embodiment of the structure can comprise the first device and multiple second devices, including both an SRAM cell and an analog device, as described above.

Additionally, the semiconductor structure of the invention can comprise a dual-strain layer (e.g., a dual-strain nitride layer) over both the first device and the second device. Specifically, the dual-strain layer can comprise a first tensile section over the first n-type transistor of the first device, a compressive section over the first p-type transistor of the first device and an additional tensile section over the second device. The additional tensile section over the second device can further comprise a relaxed region. Specifically, the additional tensile section can comprise a germanium or arsenic ion-implantation region that relaxes the strain in a predefined area above the second device so as to minimize transconductance variability.

Also disclosed are embodiments of a method of forming the semiconductor structure discussed above. The method comprises forming a first device and a second device on a substrate. Forming the first device comprises forming a device (e.g., a digital circuit) that comprises an n-type transistor (i.e., a first n-type transistor) and a p-type transistor (i.e., a first p-type transistor). In one embodiment of the method, forming of the second device comprises forming a device (e.g., an SRAM cell) that comprises at least one n-type transistor (i.e., a second n-type transistor) and at least one p-type transistor (i.e., a second p-type transistor). In another embodiment of the method, forming of the second device comprises forming an analog device (e.g., an analog n-FET or an analog p-FET). In another embodiment of the method, forming the second device further comprises forming multiple second devices including both an SRAM cell and an analog device, as described above.

A dual-strain layer is formed over both the first device and the second device. Specifically, a first tensile section of the dual-strain layer is formed over a first n-type transistor of the first device, a compressive section is formed over a first p-type transistor of the first device and an additional tensile section is formed over the second device(s).

Then, a region of the additional tensile section above the second device is relaxed. This can be accomplished by first forming a mask over the dual-strain layer such that a predefined area of the additional tensile section above the second device is exposed. For example, if the second device is an SRAM cell, a predefined area of the additional tensile section above the p-type transistor of the SRAM cell (i.e., the second p-type transistor) can be exposed. If the second device is either an analog p-FET or analog n-FET a predefined area of the additional tensile section above the analog FET can be exposed. This predefined area is relaxed by performing an ion implantation process using, for example, germanium, arsenic, or any other suitable noble gas implant.

These and other aspects of the embodiments of the invention will be better appreciated and understood when considered in conjunction with the following description and the accompanying drawings. It should be understood, however, that the following descriptions, while indicating exemplary embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS OF THE INVENTION

Figure 1:
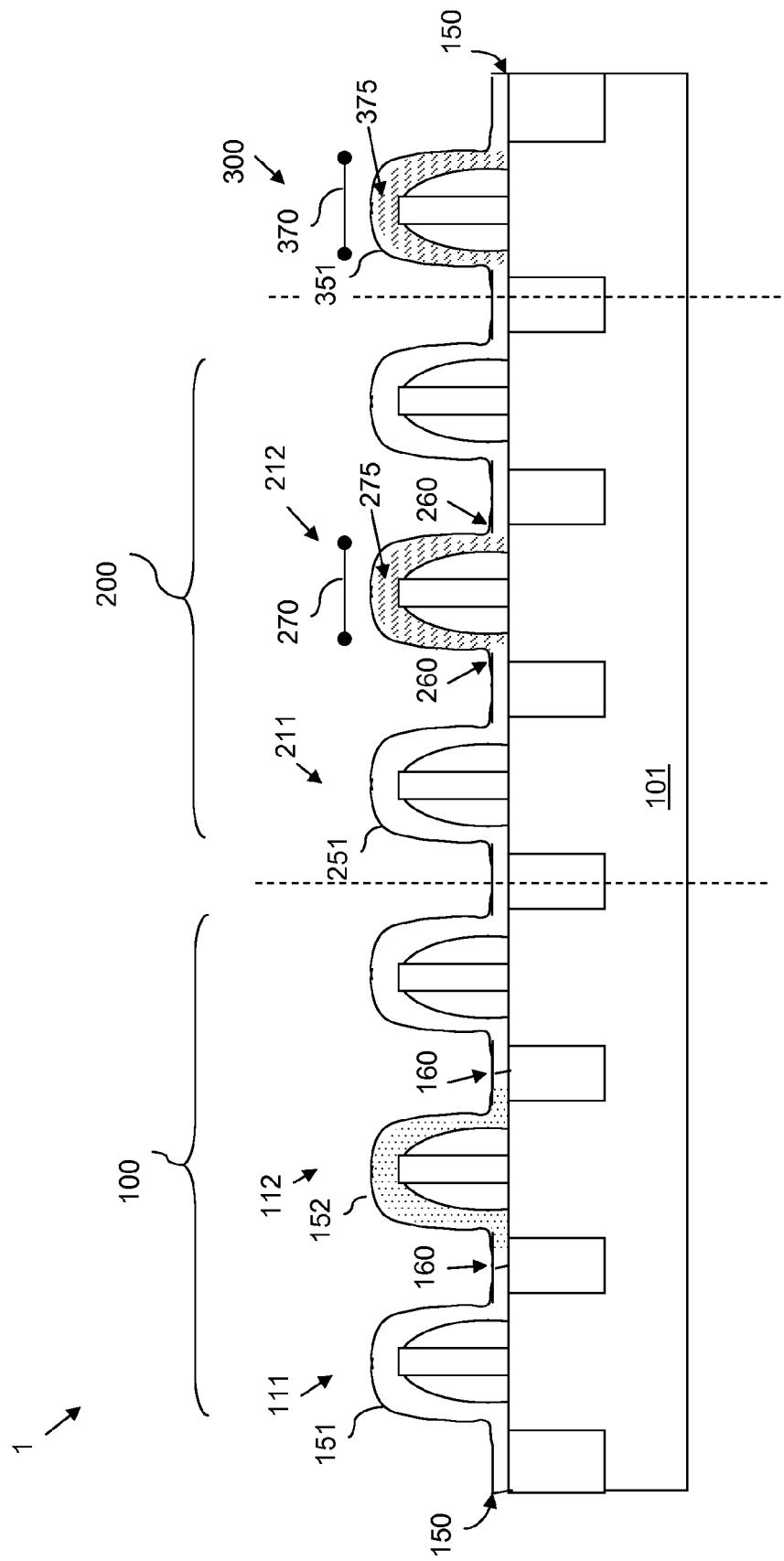
FIG. 1 is a schematic diagram illustrating an embodiment of a semiconductor structure of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above and referring to digital logic 100 of FIG. 1, current state-of-the-art complementary MOSFET (CMOS) devices and other semiconductor structures, in which both n-FETs 111 and p-FETs 112 are formed on the same chip (i.e., substrate 101), often incorporate a dual-strain nitride layer 150 to enhance mobility in both the n-FETs 111 and the p-FETs 112. Such a dual-strain nitride layer 150 is a nitride layer that has tensile strain regions 151 and compressive strain regions 152 positioned over the n-FETs 111 and the p-FETs 112, respectively, in order to simultaneously enhance carrier mobility in the channel regions of each of the FETs 111, 112.

Various masking and physical overlay processes can be used to place the different strain regions 151, 152 and, thus, to form the dual-strain nitride layer 150 such that the boundaries 160 between the different strain regions 151, 152 fall between the n-FETs 111 and p-FETs 112. However, since a physical overlay is involved in the placement of the different strain regions 151, 152, there can be significant variability in the nFET 111 and pFET 112 resultant strains depending on the proximity of the individual FETs 111, 112 to this boundary 160. As a result, there can be an increased variability in the transconductance of such transistors. While this increased transconductance variability may not significantly affect digital logic 100 performance, it can lead to a decrease static random access memory (SRAM) cell stability and performance. Such transconductance variability can also negatively affect the stability and performance of both analog n-FETs and p-FETs.

In view of the foregoing, disclosed below is a low-cost solution with good performance and stability trade-offs for digital circuits and SRAM cells and/or analog FETs on the same chip. Specifically, a dual-strain layer is formed over digital circuits and other devices on a chip. The dual-strain layer comprises tensile sections above digital logic n-type transistors, compressive sections above digital logic p-type transistors and additional tensile sections above SRAM cells and/or analog FETs. An amorphization ion-implant is performed to relax the strain over SRAM cell p-FETs and, thereby, eliminate variability and avoid p-FET performance degradation in the SRAM cells. Additionally, this ion-implant can relax the strain above both analog p-FETs and n-FETs and, thereby, eliminate variability and the coupling of the logic device process to the analog FETs and provide more predictable and well-controlled analog FETs.

More particularly, referring to FIG. 1, disclosed is a semiconductor structure 1 that comprises a first device 100 and at least one second device (e.g., 200 and/or 300) on a substrate. The first device 100 can comprise a digital circuit such as, a digital complementary metal oxide semiconductor (CMOS) device. Specifically, the first device 100 can comprise at least one n-type transistor (i.e., a first n-type transistor 111) and at least one p-type transistor (i.e., a first p-type transistor 112). In one embodiment of the structure 1 the second device can comprise a static random access memory (SRAM) cell 200. Specifically, this second device can comprise at least one n-type transistor (i.e., a second n-type transistor 211) and at least one p-type transistor (i.e., a second p-type transistor 212). In another embodiment of the structure 1 the second device can comprise an analog device 300, such as an n-type analog field effect transistor (FET) or a p-type analog FET. Another embodiment of the structure 1 can comprise the first device 100 and multiple second devices, including both an SRAM cell 200 and an analog device 300, as described above.

Additionally, the semiconductor structure 1 of the invention can comprise a dual-strain layer 150 (e.g., a dual-strain nitride layer) over both the first device 100 and the second device(s) (e.g., SRAM 200 and/or analog device 300). The dual-strain layer 150 can comprise a first tensile section 151 over the first n-type transistor 111 of the first device 100, a compressive section 152 over the first p-type transistor 112 of the first device 100 and an additional tensile section over the second device. Specifically, the dual strain layer 150 may comprise an additional tensile section 251 over SRAM cell 200 and/or an additional tensile section 351 over analog FET 300. This additional tensile section 251, 351 can further comprise a relaxed region (e.g., relaxed region 275 of section 251 of SRAM cell 200 and/or relaxed region 375 of section 351 of analog FET 300). Specifically, the additional tensile section can comprise a germanium or arsenic ion-implantation region that relaxes the strain in a predefined area above the second device (e.g., predefined area 270 of section 251 above the SRAM cell 200, or predefined area 370 of section 351 above the analog FET 300) so as to minimize transconductance variability.

More particularly, if the second device comprises an SRAM cell 200, a relaxed region 275 is incorporated into a predefined area 270 of the additional tensile section 251 of the dual-strain layer 150 above the second p-type transistor 212. The proximity of the second p-type 212 and n-type 211 transistors to the boundary 260 surrounding the relaxed region 275 is much less critical than it would be if a compressive section of the dual-strain layer was placed above the second p-type transistor 212 instead. Specifically, the proximity is not as critical because there is only a single overlay (e.g., an ion-implantation (I/I) mask only) required in the formation process and because the length scale of the relaxed region 275 can be much smaller than the length of a compressive section. Thus, this embodiment of the invention provides a semiconductor structure 1 having both a digital logic 100 and an SRAM cell 200. A ion-implant induced relaxed region 275 of the dual-strain nitride layer above the p-type transistor 212 of the SRAM cell 200 ensures that the p-type transistor is of normal strength (i.e., has optimal carrier mobility). Additionally, both the p-type 212 and n-type 211 transistors of the SRAM cell 200 do not have added variability which could lead to decreased cell 200 stability and performance.

Similarly, if the second device comprises either an analog n-FET or an analog p-FET 300, then the relaxed region 375 of the additional tensile section 351 of the dual-strain layer 150 is incorporated into a predefined area 370 above either type of analog FET 300. Although previously only the tensile film above a p-FET would have been relaxed in order to enhance carrier mobility, the present invention balances the need for a stable analog device 300 (i.e., a device with minimal transconductance variability, threshold voltage variability, ion variability, etc.) with possible carrier mobility degradation. Thus, this embodiment of the invention provides a semiconductor structure 1 having both a digital logic 100 and an analog device 300. It further eliminates variability and the coupling of the logic device 100 process to the analog FET 300 and, thereby, provides a more predictable and well-controlled analog device 300 (albeit an analog FET with potentially degraded carrier mobility).

Figure 2:
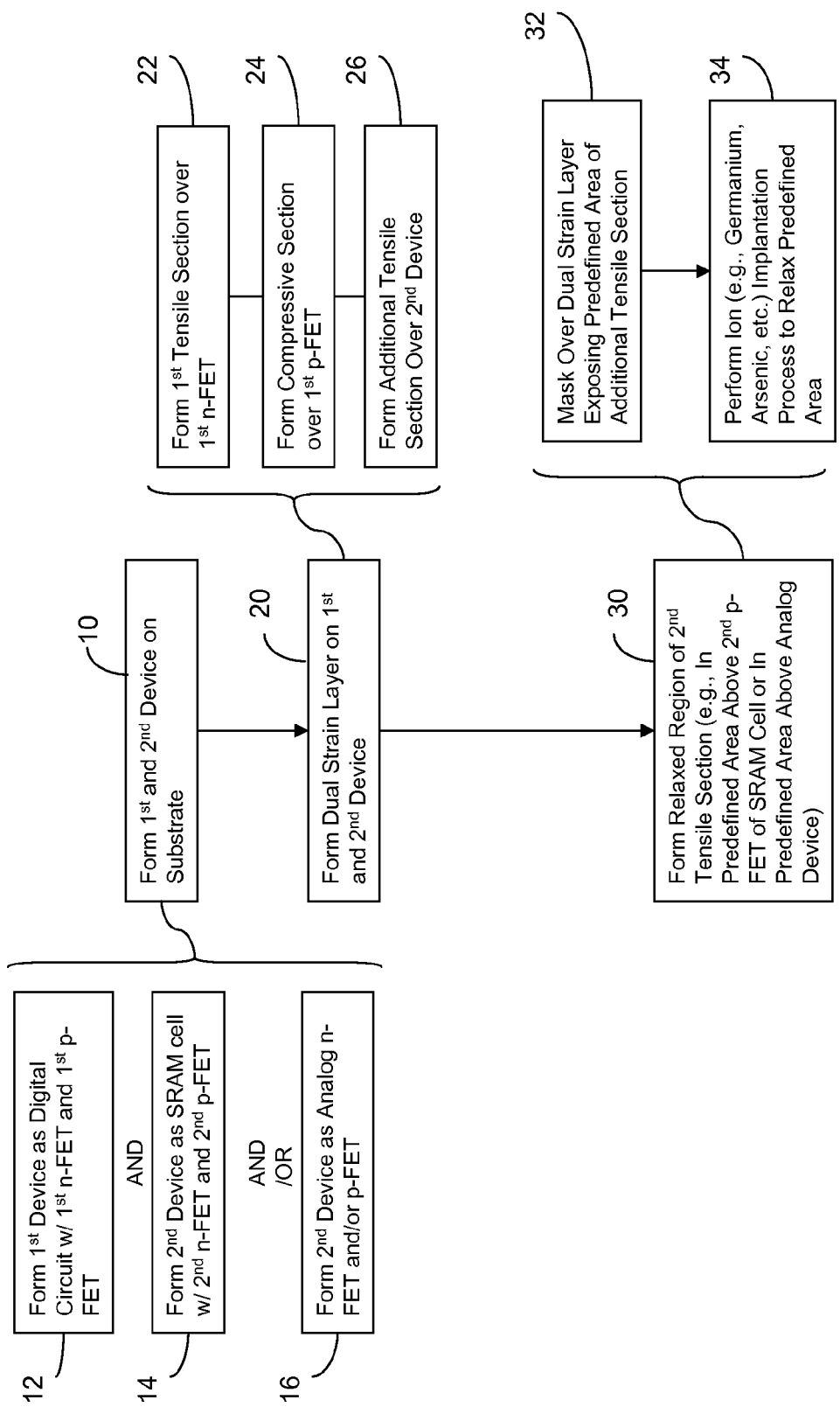
FIG. 2 is a schematic flow diagram illustrating an embodiment of the method of the invention.
Figure 3:
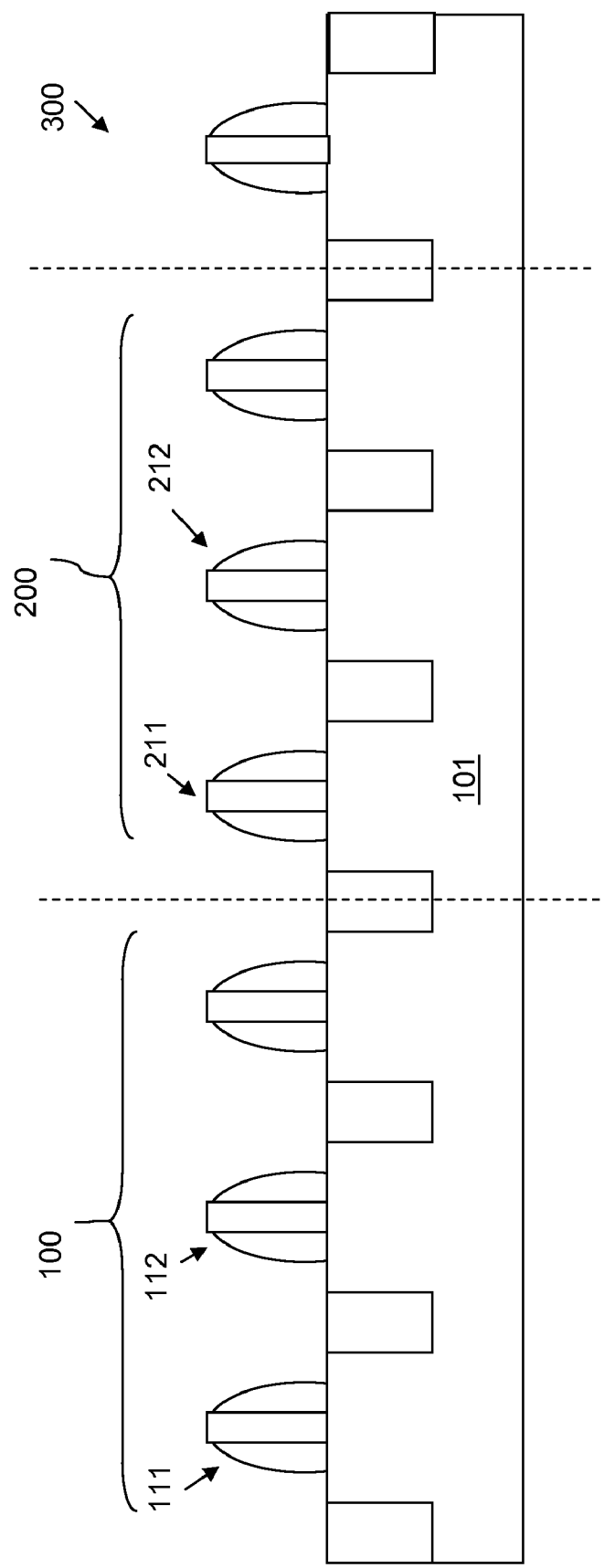
FIG. 3 is a schematic diagram illustrating a partially completed structure of the invention.

Referring to FIG. 2, also disclosed are embodiments of a method of forming the semiconductor structure discussed above. The method comprises forming a first device 100 and a second device (e.g., second device 200 and/or second device 300) on a substrate 101 (10, see FIG. 3). Forming the first device 100 comprises forming a device (e.g., a digital circuit) that comprises an n-type transistor (i.e., a first n-type transistor 111) and a p-type transistor (i.e., a first p-type transistor 112) (12). In one embodiment of the method, forming of the second device comprises forming a device (e.g., an SRAM cell 200) that comprises at least one n-type transistor (i.e., a second n-type transistor 211) and at least one p-type transistor (i.e., a second p-type transistor 212) (14). In another embodiment of the method, forming of the second device comprises forming an analog device 300 (e.g., an analog n-FET or an analog p-FET) (16). In another embodiment of the method, forming the second device further comprises forming multiple second devices including both an SRAM cell 200 and an analog device 300, as described above (14-16).

Figure 4:
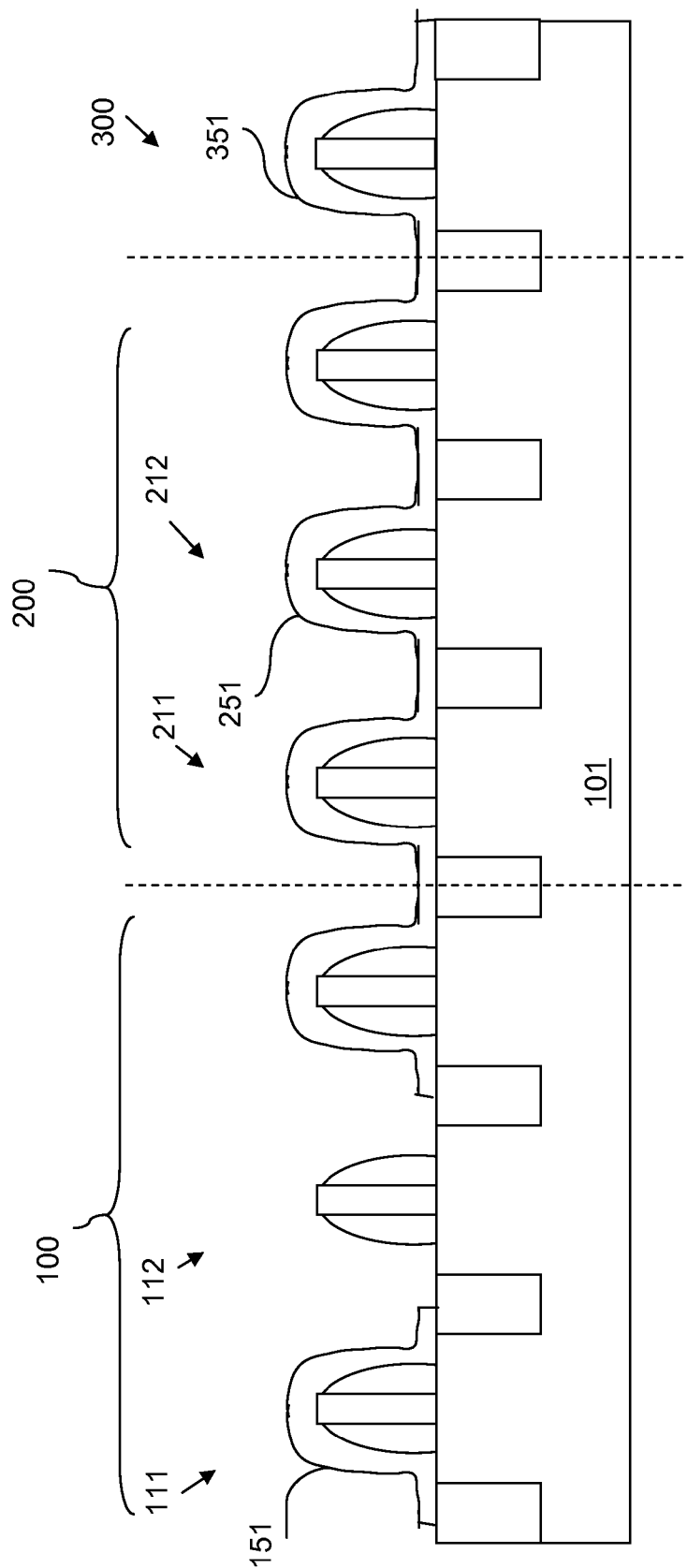
FIG. 4 is a schematic diagram illustrating a partially completed structure of the invention.
Figure 5:
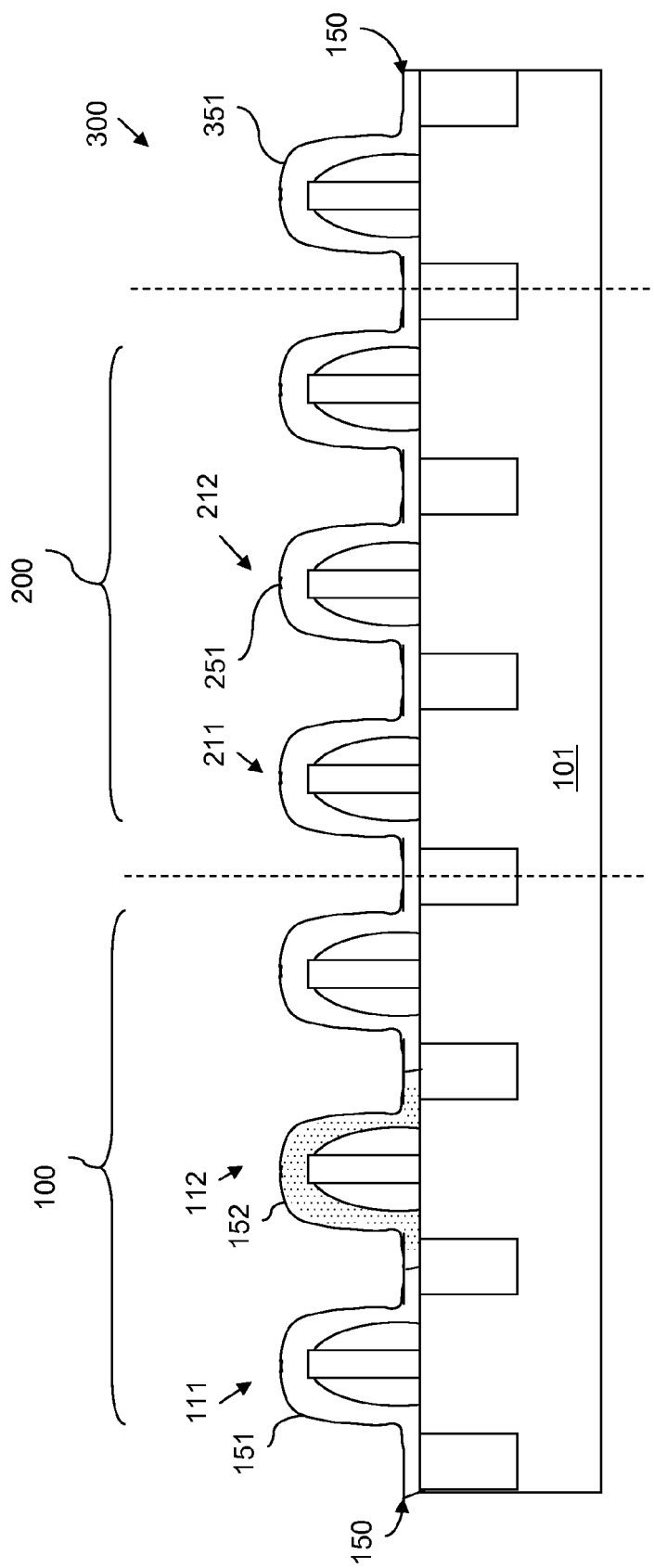
FIG. 5 is a schematic diagram illustrating a partially completed structure of the invention.

A dual-strain layer 150 is formed over both the first device 100 and the second device(s) 200 and/or 300 (20). Specifically, a first tensile section 151 of the dual-strain layer 150 is formed over a first n-type transistor 111 of the first device 100, a compressive section 152 is formed over a first p-type transistor 112 of the first device 100 and an additional tensile section is formed over the second device(s) (e.g., see additional tensile section 251 over SRAM cell 200 and additional tensile section 351 over analog FET 300) (22-26, see FIGS. 4-5). Conventional masking and overlaying techniques may be used to form this dual-strain layer 150.

Figure 6:
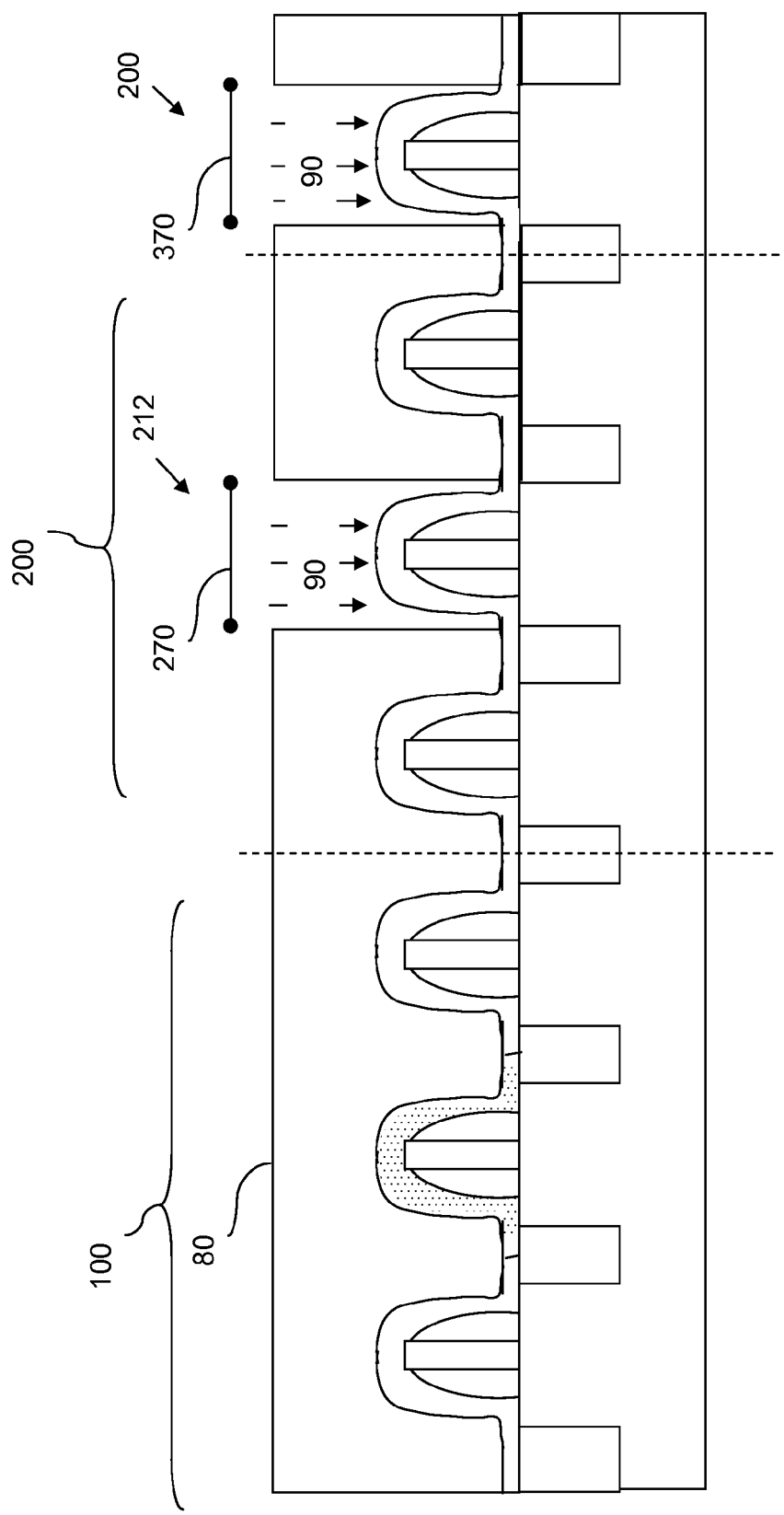
FIG. 6 is a schematic diagram illustrating a partially completed structure of the invention.

Then, a region of the additional tensile section above the second device is relaxed so as to minimize transconductance variability in the second device (30, see FIG. 6). This can be accomplished by first forming a mask 80 over the dual-strain layer 150 such that a predefined area of the additional tensile section above the second device is exposed (32). The mask 80 can be formed by depositing a suitable mask material and lithographically patterning the mask material to expose the predefined areas. More particularly, if the second device is an SRAM cell 200, a predefined area 270 of the additional tensile section 251 above the p-type transistor 212 of the SRAM cell 200 (i.e., the second p-type transistor) can be exposed by the mask 80. If the second device is either an analog p-FET or analog n-FET 300 a predefined area 370 of the additional tensile section 351 above the analog FET 300 can be exposed by the mask 80. The predefined areas 270 and/or 370 can be relaxed by performing an amorphization ion implantation process of approximately $1 \times 10^{14}$ cm$^2$ using, for example, germanium, arsenic, or any other suitable noble gas implant 90 (34).

Therefore, disclosed above is a low-cost solution with good performance and stability trade-offs for digital circuits and SRAM cells and/or analog FETs on the same chip. Specifically, a dual-strain layer is formed over digital circuits and other devices on a chip. The dual-strain layer comprises tensile sections above digital logic n-type transistors, compressive sections above digital logic p-type transistors and additional tensile sections above SRAM cells and/or analog FETs. An amorphization ion-implant is performed to relax the strain over SRAM cell p-FETs and, thereby, eliminate variability and avoid p-FET performance degradation in SRAM cells. Additionally, this ion-implant can relax the strain above both analog p-FETs and n-FETs and, thereby, eliminate variability and the coupling of the logic device process to the analog FETs and provide more predictable and well-controlled analog FETs.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. A semiconductor structure comprising:
    a substrate;
    a first device on said substrate and comprising a first n-type transistor and a first p-type transistor;
    a second device on said substrate adjacent said first device, wherein said second device comprises a second n-type transistor and a second p-type transistor; and
    a dual-strain layer over said first device and said second device, wherein said dual-strain layer comprises:
        a first tensile section over said first n-type transistor and a compressive section over said first p-type transistor; and
        an additional tensile section over said second device, wherein said additional tensile section comprises a relaxed region above said second p-type transistor and not above said second n-type transistor and wherein said relaxed region comprises a predefined area that minimizes degradation of performance of said second p-type transistor and that further minimizes variability in transconductance of said second p-type transistor and said second n-type transistor in said second device so as to avoid degradation of performance and stability of said second device.

2. The semiconductor structure of claim 1, wherein said first device comprises a digital circuit.

3. The semiconductor structure of claim 1, wherein said second device comprises a static random access memory cell.

4. The semiconductor structure of claim 1, wherein said relaxed region comprises one of a germanium ion-implantation region and an arsenic ion-implantation region.

5. A semiconductor structure comprising:
a substrate;
a first device on said substrate and comprising a first n-type transistor and a first p-type transistor;
at least one static random access memory cell on said substrate and comprising a second n-type transistor and a second p-type transistor;
at least one analog transistor on said substrate; and
a dual-strain layer over said first device, said static random access memory cell and said analog transistor, wherein said dual-strain layer comprises:
a first tensile section over said first n-type transistor and a compressive section over said first p-type transistor; and
additional tensile sections over said static random access memory cell and said analog transistor, wherein said additional tensile sections comprise relaxed regions, and wherein said relaxed regions comprise:
a first relaxed region above said second p-type transistor and not above said second n-type transistor, wherein said first relaxed region comprises a predefined area that minimizes degradation of performance of said second p-type transistor and that further minimizes variability in transconductance of said second p-type transistor and said second n-type transistor in said static random access memory cell so as to avoid degradation of performance and stability of said static random access memory cell; and
a second relaxed region above said analog transistor.

6. The semiconductor structure of claim 5, wherein said first device comprises a digital circuit.

7. The semiconductor structure of claim 5, wherein said relaxed regions comprise one of germanium ion-implantation regions and arsenic ion-implantation regions.

8. The semiconductor structure of claim 5, wherein said analog transistor comprises an n-type transistor.

9. The semiconductor structure of claim 5, wherein said analog transistor comprises a p-type transistor.

* * * * *